United States Patent
Lemme et al.

(10) Patent No.: US 6,309,508 B1
(45) Date of Patent: Oct. 30, 2001

(54) SPINNING DISK EVAPORATOR

(75) Inventors: Charles Daniel Lemme; Marc G. Langlois, both of Tucson, AZ (US)

(73) Assignee: 3M Innovative Properties Company, St. Paul, MN (US)

( * ) Notice: Subject to any disclaimer, the term of this patent is extended or adjusted under 35 U.S.C. 154(b) by 0 days.

(21) Appl. No.: 09/007,589

(22) Filed: Jan. 15, 1998

(51) Int. Cl.[7] .............. B01D 1/22; B01D 3/42; C23C 16/52

(52) U.S. Cl. ............ 159/49; 159/6.1; 159/11.3; 159/12; 159/13.1; 159/44; 159/47.1; 202/238; 202/236; 203/1; 427/248.1

(58) Field of Search .................. 159/11.1, 13.1, 159/11.3, 6.1, 12, 44, 43.1; 427/248.1, 75, 127, 251, 374.1; 202/251, 239, 236; 203/1, 89, 90; 118/723 VE, 75, 251, 7, 9, 726

(56) References Cited

U.S. PATENT DOCUMENTS

| | | | |
|---|---|---|---|
| 1,001,660 | * 8/1911 | Macklind | 159/11.3 |
| 2,343,667 | * 3/1944 | Hickman | 202/238 |
| 3,724,523 | * 4/1973 | Rattern | 159/13.2 |
| 3,878,028 | * 4/1975 | Balch | 159/12 |
| 3,890,205 | 6/1975 | Schnitzer | 202/236 |
| 4,290,384 | 9/1981 | Ausschnitt et al. | 118/722 |
| 4,311,570 | * 1/1982 | Conen et al. | 422/186 |
| 4,325,986 | 4/1982 | Baron et al. | 427/74 |
| 4,451,507 | * 5/1984 | Beltz et al. | 427/240 |
| 4,490,774 | 12/1984 | Olson et al. | 361/311 |
| 4,543,275 | 9/1985 | Akashi et al. | 427/250 |
| 4,545,352 | 10/1985 | Jourde et al. | 123/447 |
| 4,731,159 | * 3/1988 | Porter et al. | 159/6.1 |
| 4,782,807 | 11/1988 | Takahashi | 123/506 |
| 4,842,893 | 6/1989 | Yializis et al. | 427/44 |
| 4,954,371 | 9/1990 | Yializis | 427/44 |
| 5,032,461 | 7/1991 | Shaw et al. | 428/461 |
| 5,045,155 | * 9/1991 | Ramsland | 159/6.1 |
| 5,094,721 | * 3/1992 | Petrick | 159/47.1 |
| 5,334,290 | * 8/1994 | Nuns et al. | 202/238 |
| 5,440,446 | 8/1995 | Shaw et al. | 361/301.5 |
| 5,624,409 | * 4/1997 | Seale | 604/246 |
| 5,674,575 | * 10/1997 | Atwell et al. | 427/561 |

FOREIGN PATENT DOCUMENTS

| | | | |
|---|---|---|---|
| 1519627 | 10/1970 | (DE) . | |
| 0025552 | * 6/1906 | (GB) | 159/11.3 |
| 873914 | 8/1961 | (GB) . | |
| 1072869 | 6/1976 | (GB) . | |

OTHER PUBLICATIONS

SAE Technical Paper Series, Pub. No. 880421, *EMI—Series—Electromagnetic Fuel Injection Pumps*, by Michael M. Schechter and Alador O. Simko, Feb. 29–Mar. 4, 1988.

SAE Technical Paper Series, Pub. No. 881098, *Current Instrumentation for Field–Deployable Analysis of Organic Compounds*, by E. B. Overton, R. W. Sherman, E. S. Collard, P. Klinkhachorn and H. P. Dharmasena, Jul. 11–13, 1988.

(List continued on next page.)

Primary Examiner—Virginia Manoharan
(74) Attorney, Agent, or Firm—Melanie G. Gover (57) ABSTRACT

Liquid organic material is controllably delivered to a receptacle located in the center of a heated surface capable of horizontally rotating about its central axis. As the heated surface rotates, material deposited within the central receptacle is forced outwardly and across the rotating surface. As the material moves radially, it evaporates into a vapor which is then transported to one or more nozzles. From the nozzles, the vapor is applied to a substrate and condensed. Relative to existing devices and methods, the present invention enables the evaporation of a wider variety of organic liquids, greater reliability in continuous operation, a decrease in maintenance, and a larger and more constant material flow rate.

10 Claims, 5 Drawing Sheets

OTHER PUBLICATIONS

SAE Technical Paper Series, Pub. No. 85043, *An Electrode Fuel Injection System for Diesel Engines*, by P. E. Glikin, Feb. 25–Mar. 1, 1985.

SAE Technical Paper Series, Pub. No. 840273, *Direct Digital Control of Electronic Unit Injectors*, by N. John Beck, Robert L. Barkhimer, Michael A. Calkins, William P. Johnson, and William E. Weseloh, Feb. 27–Mar. 2, 1984.

* cited by examiner

SPINNING DISK EVAPORATOR

FIELD OF THE INVENTION

The present invention relates to an apparatus and a method for the improved evaporation of organic liquids for vapor deposition onto substrates in vacuum environments. Relative to existing devices and methods, the present invention enables the evaporation of a wider variety of organic liquids, greater reliability in continuous operation, a decrease in maintenance, and a larger and more constant material flow rate.

BACKGROUND AND OBJECTS OF THE INVENTION

Numerous industries utilize evaporation-vapor deposition systems to coat substrates with desired materials. Illustrative of such applications are U.S. Pat. Nos. 4,290,384, 4,842,893, 4,490,774, 4,325,986, and 4,543,275. Specifically, organic compounds are utilized as coatings in applications as diverse as protective materials, product packaging, informational displays, and electronic devices.

The process of depositing a thin layer of organic material onto a substrate consists of three major steps. First, the compound must be evaporated. Second, the organic vapor must be transported to the substrate, and third, the vapor must be condensed onto the substrate. The evaporation step, however, is in inherent conflict with the final condensation step. Easily evaporated organic compounds are hard to condense while hard to evaporate compounds are easier to condense. Because the condensation process is influenced by numerous processes that are difficult to control, efforts have concentrated on developing evaporator technology that can vaporize organic compounds at a low enough temperature to enhance the probability of condensation.

To meet the requirements of many industrial applications, an evaporator-vapor deposition apparatus and method should be capable of employing a wide range of liquids, operating at low temperatures and pressures to avoid material polymerization or degradation, achieving a wide range of mass flow rates, operating continuously for substantial periods of time without requiring maintenance, and achieving a uniform deposition of material on the target substrate.

Existing methods and devices for evaporating and depositing organic compounds on a substrate include ultrasonic evaporators, as shown in U.S. Pat. No. 4,842,893, and spinning disk/heated wall evaporators, as shown in U.S. Pat. No. 4,954,371.

Ultrasonic evaporators are typically comprised of a liquid delivery system supplying liquid through a liquid dispenser into the center of a horn shaped structure. The horn shaped structure flares into a cone shape at one end and is positioned within an enclosed evaporation chamber with heated walls. Liquid from the dispenser is drawn through an angle of 120 degrees and onto the cone area by capillary action. The horn undergoes a sinusoidal acceleration, exerts a force on the liquid, and induces a sinusoidal pressure variation as it accelerates the liquid. The degree of acceleration is dependent upon the effective coupling strength of the solid surface of the horn to the liquid on its surface. The liquid, accelerated by the horn motion, separates into smaller droplets which leave the horn, impinge upon the heated evaporator walls, and vaporize.

Problems occur, however, when the ultrasonic evaporation process is attempted in low pressure environments. At atmospheric pressure, the coupling strength between the solid horn surface and liquid is sufficient to enable acceleration and droplet formation. As pressures decrease, the more volatile components of the liquid vaporize causing the formation of vapor pockets at the interface between the liquid and horn surface, the decoupling of the liquid from the horn surface, and, consequently, the inhibition of droplet formation. Larger droplets therefore impinge the evaporator wall and, because of the temperature gradient and increased temperature in the droplet interior, the liquid polymerizes. Under low pressure environments, ultrasonic evaporators can only be operated a few hours before cleaning the polymerized liquid is required. Because this is an inherent consequence of the ultrasonic evaporator design, ultrasonic evaporators can only be operated in higher pressure environments, rendering them unsuitable for low pressure vapor formation.

Conventional spinning disk/heated wall evaporators employ a capillary feeder to deliver liquid droplets to a rotating disk which then accelerates the droplets against the interior of a heated container, causing the droplets to evaporate. While the droplets when ejected off the surface of the spinning disk are small, they are unable to evaporate before subsequent drops are ejected and impinge on the same evaporator wall surface area. The result is a ring of polymerized or decomposed material that builds as a barrier between newly ejected droplets and the heat source. During operation, this system rapidly degenerates and requires frequent cleaning. This is a natural consequence of the limited surface area against which the ejected droplets may contact the heated wall. Solutions would require increasing the contact surface area through, possibly, constant vertical adjustment of the spinning disk to avoid consecutive ejectment of liquid material to the same wall area.

Both conventional spinning disk and ultrasonic evaporators have disadvantages which inhibit their effective use for evaporation of organic material in low pressure environments. Both operational schemes are subject to material flow variations which cause coating thickness variations on the substrate being coated. Currently evaporators such as conventional spinning disk and ultrasonic evaporators attempt to generate a constant gas flow rate by feeding liquid material into the apparatus at a fixed volumetric flow rate through the use of a positive displacement pump. Complications arise, however, due to the low pressure in the evaporator which produces low pressure in the feed tube. Because desirable organic liquids in their commercial form are a blend of compounds with varying vapor pressures, the low pressure in the feed tube causes certain high vapor pressure components to vaporize in the feed tube prior to delivery into the evaporator, thereby creating a vapor pocket within the feed tube, forcing the rapid expulsion of liquid situated in front of the vapor pocket, and providing no liquid flow when the vapor pocket exits the feed tube. To minimize this flow variation, prior art evaporators employ feed systems which incorporate a length of capillary tubing immediately between the feed tube and the evaporator environment. The capillary tubing provides viscous frictional resistance to the liquid flow, thereby sustaining pressure in the feed tube. This solution, however, does not completely eliminate the existence of low pressure in the capillary tubing. Consequently, certain organic liquid components still tend to evaporate prior to exiting the capillary tubing, generating vapor pockets in the capillary tubing and causing a pulsation of liquid flow and pressure pulsation in the evaporator. The alternate release of liquid and vapor causes variations in coating thickness on the substrate.

Additionally, because ultrasonic and conventional spinning disk evaporators have a common dependence on capillary action to deliver the requisite liquid to the evaporator apparatus, the viscosity of the liquid being evaporated is limited to that of a liquid having a viscosity less than 100 cps. When the viscosity rises above 100 cps, the pressure required to drive the liquid out of the capillary tubing becomes very high. The increased pressure raises the shear stress on the liquid thereby initiating polymerization in the capillary tubing and, consequently, rapidly leading to clogging of the tubing. To dispense fluids that have a room temperature viscosity above 100 cps is to heat the liquid. Heating, however, makes the liquid susceptible to polymerization and, therefore, could also result in clogging.

Finally, because of the rapid build-up of polymerized or degraded organic material, both ultrasonic and conventional spinning disk devices have short operation times. Short operational times are inefficient and adversely impact productivity.

SUMMARY OF THE INVENTION

The present invention represents a marked improvement over existing methods and devices for evaporating and vapor depositing organic liquids.

Liquid organic material is controllably delivered to a receptacle located in the center of a heated surface capable of horizontally rotating about its central axis. As the heated surface rotates, material deposited within the central receptacle is forced outwardly and across the rotating surface. As the material moves radially, it evaporates into a vapor which is then transported to one or more nozzles. From the nozzles, the vapor is applied to a substrate and condensed.

Figure 3:
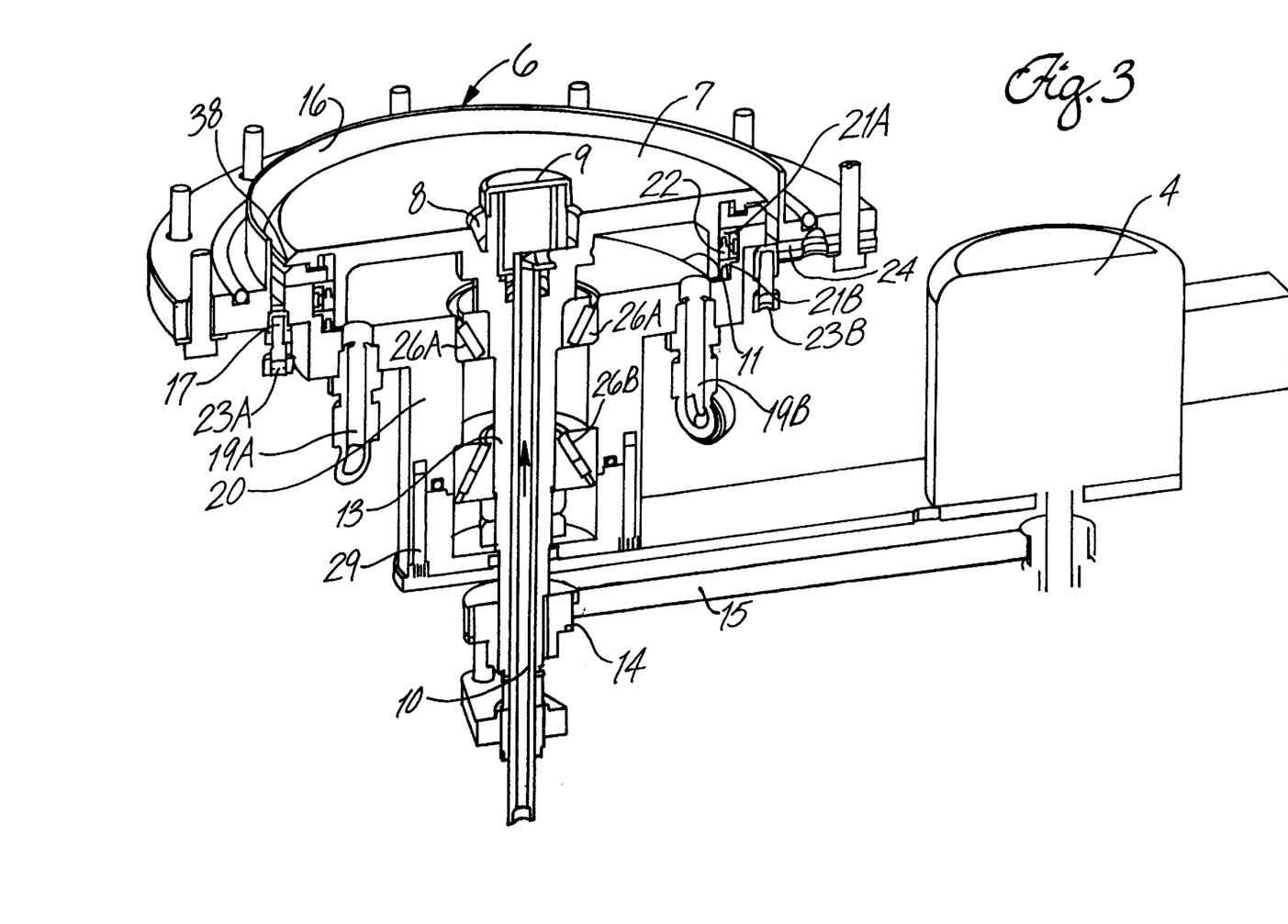

A time varying orifice in combination with a conduit and a liquid delivery system supplies liquid to the evaporator without the pressure and molecular weight limitations of conventional evaporators. By increasing conduit size and eliminating the use of a capillary feeder, the present invention avoids the premature vapor formation problems of conventional evaporators and the clogging problems which occur with high molecular weight compounds.

Additionally, by using a large rotating surface as the vaporizing surface, the present invention substantially increases the amount of surface area available for thermal contact with the liquid, thereby increasing the potential mass flow rates achievable and the range of organic liquids employable in an evaporator.

Finally, because the present invention works in low pressure environments, unlike conventional evaporators, condensation and uniform vapor deposition are more easily facilitated.

It is an object of this invention to provide an apparatus and method that increases the range of organic liquids which can be employed in a single evaporator.

It is another object of this invention to provide an apparatus and method that improves the productivity of evaporators by increasing continuous operational time and decreasing maintenance requirements.

It is a further object of this invention to provide an apparatus and method that provides a larger and more constant material flow rate relative to existing evaporators and that provides for uniform vapor deposition on the target substrate.

It is a further object of this invention to provide an apparatus and method which eliminates the pulsation in flow and pressure that occur with prior art evaporators.

It is a further object of this invention to provide an apparatus and method which increases the size of the liquid molecules that can be evaporated without cracking the chemical bonds of the molecule.

It is a further object of this invention to enhance the ability to condense smaller molecules as compared to prior art evaporators.

BRIEF DESCRIPTION OF THE DRAWINGS

FIG. 1 is a schematic view of an organic liquid evaporation and condensation apparatus;

FIG. 2 is a side perspective of a preferred embodiment of the organic liquid evaporator;

FIG. 3 is a cross-sectional side perspective view of the preferred embodiment taken from A–A' in FIG. 2 of the organic liquid evaporator embodying the present invention;

FIG. 4 is an exploded side perspective view of a preferred embodiment of a liquid delivery system portion of the organic liquid evaporator; and FIG. 5 is a top schematic view illustrating the transportation of vapor formed within the evaporator to the final product.

FIG. 6 is a cross-sectional perspective view of a preferred embodiment of a pulsed flow valve portion of the organic liquid evaporator.

DETAILED DESCRIPTION

Referring to the drawings, FIG. 1 illustrates an organic liquid evaporation and condensation apparatus. An evaporation chamber 1 that contains an evaporation apparatus [not shown] is connected by a duct 2 to a condensation chamber 3. A motor 4 which drives the evaporation apparatus and a liquid delivery system 5 capable of controllably delivering liquid to the evaporation apparatus are also attached to the evaporation apparatus. The relative placement of each component in FIG. 1 has been provided for illustration purposes and is not intended to limit the present invention to the illustrated configurations.

As shown in FIG. 2, and more specifically in FIG. 3, the evaporation apparatus 6, contained in evaporation chamber 1, is comprised of a substantially horizontally disposed surface 7 with a depression 8 central to the surface 7 structure, which depression is capable of acting as a receptacle for liquid material. Disposed proximate to the depression 8 is a liquid outlet 9 capable of controllably delivering liquid from the liquid delivery system 5 attached to said liquid outlet by a conduit 10. The surface 7 itself is capable of being rotated and of being heated. The surface 7 may be resistively heated, bonded to a foil heater (i.e. a Kapton foil heater of 5 watts per square inch power density), or radiantly heated by stationary coils that radiate heat to the bottom of the surface 7, or heat may be supplied by the placement of heated material in an enclosed volume 11 located proximate to the surface 7. The surface 7 is directly or indirectly attached to a motor 4 capable of exerting force onto the surface 7 in a manner which results in the rotation of the surface 7.

Evaporation of liquid material occurs by the application of heat and centrifugal force to the liquid material deposited in the surface depression 8. When the surface 7 is rotating, centrifugal force exerted upon the liquid material which is positioned within the depression 8 central to the rotating surface 7 forces the liquid outwardly into a thin layer moving radially across the rotating surface 7. Because the rotating surface is in thermal contact with a heating element, heat is conducted to the interface between the surface 7 and the thin liquid layer and causes the liquid to evaporate.

FIG. 3 provides a detailed representation of the preferred embodiment of the evaporation apparatus 6. The surface 7 is a substantially flat circular surface, referred to as a disk, which is integral with a drive shaft 13. Disposed central to the disk 7 is the annular depression 8 within which a time varying orifice, or pulse flow valve 9, is situated. The disk diameter should be large to provide sufficient surface area contact between the disk and liquid, thereby enabling a wide range of liquids to be evaporated. As an example, a disk machined from stainless steel with a diameter of 8 inches can be used.

The pulse flow valve 9 may be an electrically actuated, pulse width modulated valve of the same type used in automobile fuel injection systems which are widely used today and for which a large body of literature exists. The SAE Technical Paper Series 880421, 881098, 850453 & 840273 explain this technology as well as U.S. Pat. Nos. 4,545,352 and 4,782,807. The drive shaft 13 is fixably attached to a pulley 14 around which a belt 15, connected to the motor 4, is positioned. Disposed within the drive shaft 13 is a conduit 10 through which liquid material may flow from the liquid delivery system 5 into the pulse flow valve 9 and, periodically, into the annular depression 8. Proximate to the inner periphery of the evaporation apparatus 6 but not in communication with the disk itself 7 are barriers 16, which receive material that did not evaporate and, therefore, is radially ejected from the disk surface 7. Ports 17 located generally underneath the barriers 16 function as passages through which vacuum pressure may be applied by a vacuum pump [not shown] to extract the material received by the barriers and to transport the material to chill traps [not shown] through a fitting 23a.

The disk 7 is heated by the application of hot liquid, preferably hot oil, controllably delivered to volume 11 which is enclosed by a housing 20 and defined at its top by the bottom surface of the disk 7. The hot liquid flows into the volume 11 through port 19a and flows out of the volume 11 through port 19b. The volume 11 within which the hot liquid is contained is sealed to prevent any mixing of the hot liquid with the liquid material being evaporated. Such mixing would contaminate the liquid material being evaporated and render it ineffective for its required use. As shown in FIG. 3., it is preferable to use two seals to achieve effective separation of the hot liquid and material being evaporated. A top seal 21a separates the area in communication with the top surface of the disk 7 and space 22 while a bottom seal 21b separates the volume 11 containing the hot liquid and space 22. Space 22 is connected to a chill trap [not shown] by a passage 24 and a fitting 23b. A benefit of the dual seal configuration is that if any hot liquid leaks through bottom seal 21b or any liquid material leaks through top seal 21a, it will be trapped in the chill trap [not shown] and will indicate to the user that the seals are failing and require replacement. Additionally, around the outer periphery of the disk surface 7 is a labyrinth seal 38 which further prevents any material from entering into the seal area because centrifugal force would prevent material from moving radially inward toward the seal. The labyrinth seal 38 prevents contaminants, such as small particles of polymerized material, from reaching the seal where they could harm the seal surfaces.

Two tapered roller bearings, 26a and 26b, are located proximate to the drive shaft 13 inside housing 20 and are fixably positioned by double nuts and a locking washer. The hot liquid in volume 11 contacts the tapered roller bearings 26a, thereby acting as a lubricant, but does not flow continuously through the bearings 26a. The lower bearings 26b operate in concert with the upper bearings 26a. The bearings 26a and 26b are tapered and pulled together by a nut on the drive shaft 13. A cap 29 located at the base of the housing 20 acts as an enclosure.

In addition to the disclosed components of the evaporator apparatus 6, there are other elements, including but not limited to bolts, "O" rings, and small shaft seals, which would be utilized in operating the present invention but which have not been described in detail because they constitute engineering details that are well known to those skilled in the art of making sealed mechanical devices. Examples include a seal placed at the base of the pulse valve 9 to prevent liquid material from leaking into the conduit 10 and an "O" ring at the top of the pulse valve 9 to insure liquid material does not leak out when the valve 9 is closed.

While the liquid delivery system will be described in relation to the preferred embodiment, liquid delivery systems currently being employed with conventional evaporation systems can be used in the present invention. A preferred embodiment for the liquid delivery system 5 is provided in FIG. 4. The system is comprised of an accumulator 30 and a screw driven, positive displacement feed pump 31 that dispenses liquid material at a constant flow rate. The accumulator 30 is attached to one input of a tee pipe connection 36. The pump 31 is attached to a second input of the tee pipe connection 36. The conduit 10 which, in one embodiment, is of a large inner diameter, approximately 0.25 inches, is attached to the third input of the tee pipe connection 36.

Figure 4:
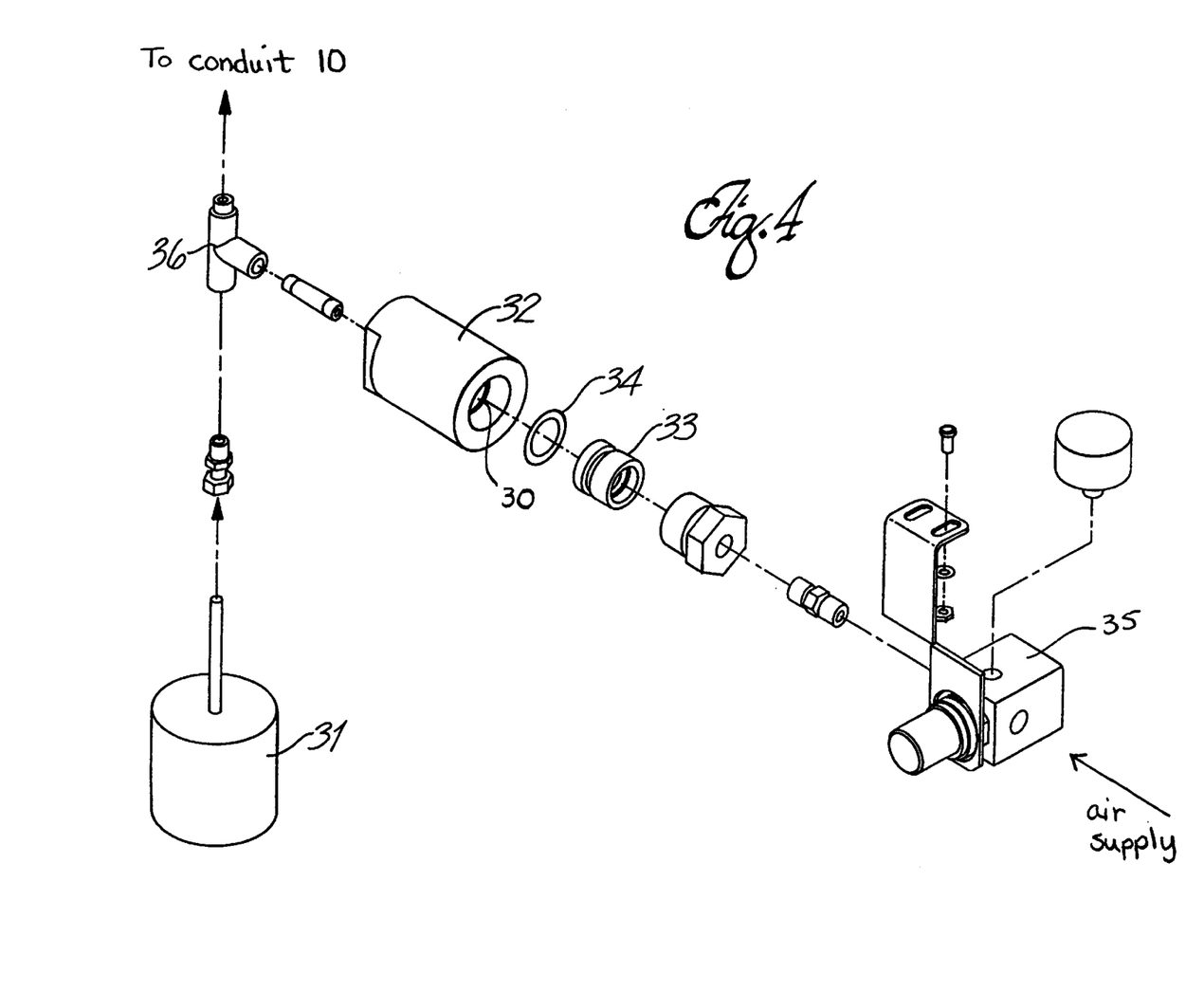

The accumulator 30 is preferably attached to the conduit 10 in a manner that minimizes the distance between the accumulator 30 and the disk 7. The cylindrical housing 32 of the accumulator 30 receives a floating piston 33 which is sealed to the inner diameter of the housing 32 by an "O" ring 34. To minimize inertia, the piston 33 is preferably hollow and made of a light weight metal, such as aluminum. The piston 33 has a solid flat surface facing the interface between the accumulator 30 and conduit 10 and acts to minimize the dead volume in the accumulator 30. The opposite end of the piston is pressurized by a regulator 35 which is attached to an air supply [not shown].

Figure 6:
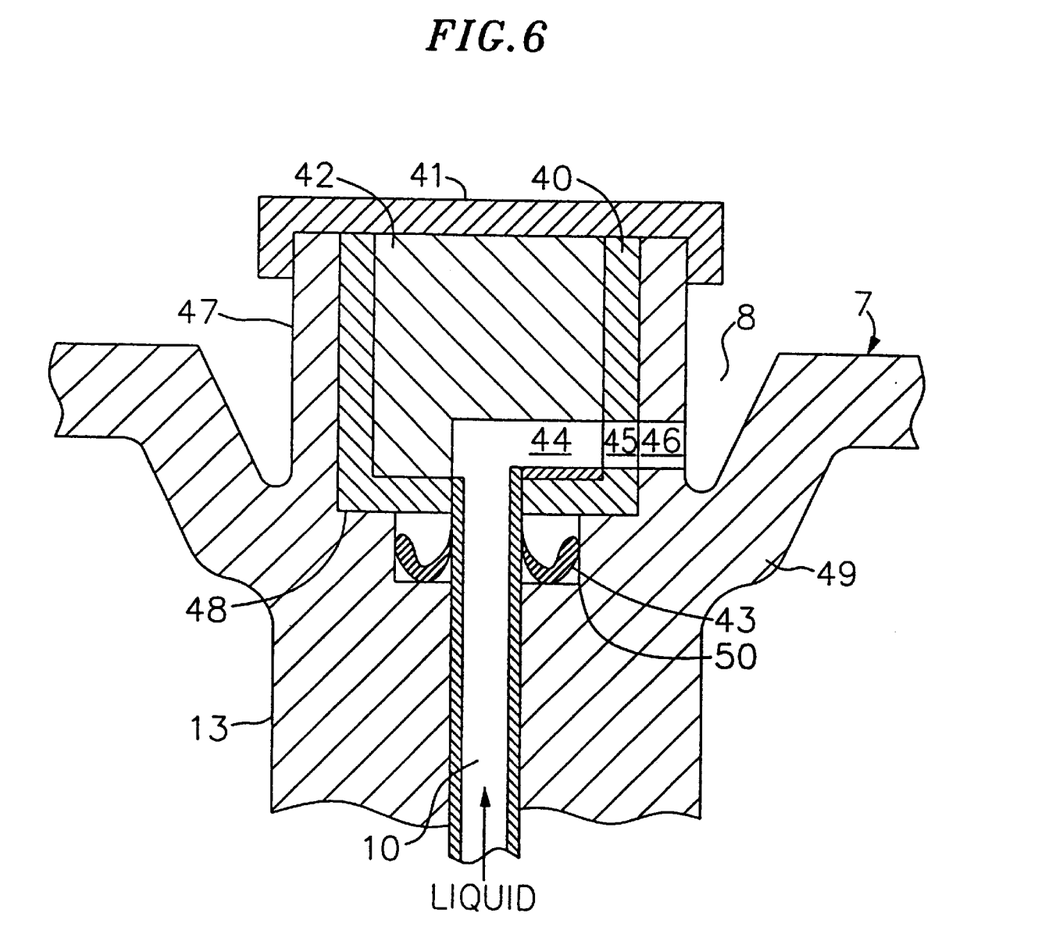

The conduit 10, disposed within the drive shaft 13, delivers the liquid material to the pulse flow valve 9, which dispenses the material into the central annular depression 8 of the disk 7. A preferred embodiment of the pulse flow valve is shown in FIG. 6. The conduit 10 is fixably attached to a cylindrical steel block 42 which has a horizontally disposed hole 44. The evaporator assembly 49 consists of the surface 7, from which the organic material evaporates, that is integral with the drive shaft 13. The depression 8 is integral to the assembly 49, extending below the surface 7 and positioned concentric to the conduit 10. Interior to the depression 8 and integral with the assembly 49 is a cylindrical projection 47 with a bottom surface 48. Concentrically positioned relative to the projection 47 is a PTFE cup 40 that is attached to the bottom surface 48 and that rotates with the assembly 49. The block 42 is concentric with and situated within the PTFE cup 40. To prevent organic liquid from flowing out of the evaporator and/or air from flowing into the evaporator, a seal 43 is placed below the PTFE cup 40, preferably a lip seal 43 which is pressed into an annular groove 50 that is machined into the assembly 49. Cross passages 44, 45, 46 are provided in the block 42, PTFE cup 40, and cylindrical projection 47 respectively. Cross passage 46 in the projection 47 connects to the bottom of depression 8. Because the PTFE cup 40 rotates with the assembly 49 while the block 42 is fixed to the conduit 10 and does not rotate, passages 44 and 45 within block 42 and PTFE cup 40 are aligned once per revolution of the assembly 49. Specifically, in the course of a revolution, cross passages 44 and 45 are misaligned, have their diameter edges touch, begin to overlap, increase in the amount of overlap, substantially coincide, and then decrease in the amount of overlap until misalignment again occurs. The periodic overlap of the block and PTFE cup passages 44 and 45 permit the dispensation of liquid into the depression 8.

While the scope of this invention is not limited to any particular structural dimensions or operational parameters for the pulse flow valve, a preferred embodiment of this invention incorporates a block 42 with an outer diameter of about one inch and cross passages 44, 45, and 46 with diameters of about 0.25 inches. Consequently, the cross passages, having a maximum circumferential overlap of about 0.5 inches, overlap about 16% of a revolution period, as measured relative to the circumference of the block 42. During the overlap period, the valve is considered "open" and material from the pump 31 and material stored in the accumulator 30 flow into the depression 8 and out and across the surface 7.

The liquid delivery system 5 in combination with the conduit 10 and pulse valve 9 operate to periodically supply the annular depression 8 located in the center of the disk 7 with organic liquid. The liquid delivery system is positioned under the evaporator surface as shown in FIGS. 3 and 4, and is a pressurized source from which the liquid is delivered to the evaporator surface. The pump 31 generates a constant flow pressurized and of organic liquid. When the valve 9 is closed, the accumulator 30, which is pressurized by air, receives the pump 31 output. When the valve 9 opens, liquid stored and pressurized and in the accumulator 30 in combination with the pressurized flow directly from the pump 31 is dispensed into the annular depression 8. The gas pressurized accumulator 30 acts to accelerate the liquid into the conduit 10 and out the open valve 9.

When the valve operation is modeled, a non-linear differential equation is derived:

$$dV/dt + V^2/(2kL)(A_t/A_o)^2 = P_a/(\rho'L)$$

where $\rho' = \rho(1+\beta)$ $\rho$ = fluid density $\beta$ = correction factor ~0.05

V = fluid velocity in conduit t = time k = valve orifice coefficient

L = conduit length $A_t$ = variable area of valve over time $A_o$ = valve orifice area $P_a$ = pressure at accumulator When solved, it is found that the design is applicable for differing conditions and is not significantly affected by variations in the chemical compositions of liquids, such as viscosity, for large diameter conduits.

The pulse valve 9 has the added benefit of mitigating some of the primary limitations of positive displacement pumps arising from the use of high viscosity liquids and their tendency to out gas between pump and outlet. Those limitations include drooling, particularly at startup, non-uniformity of flow at very slow flow rates, difficulty in producing pulsed or intermittent flow, and need to match capillary size to each organic liquid and its respective flow rate. Additionally, the pulse valve configuration is not susceptible to the premature vaporization problems encountered with the capillary feeders currently being used in existing evaporators.

Figure 1:
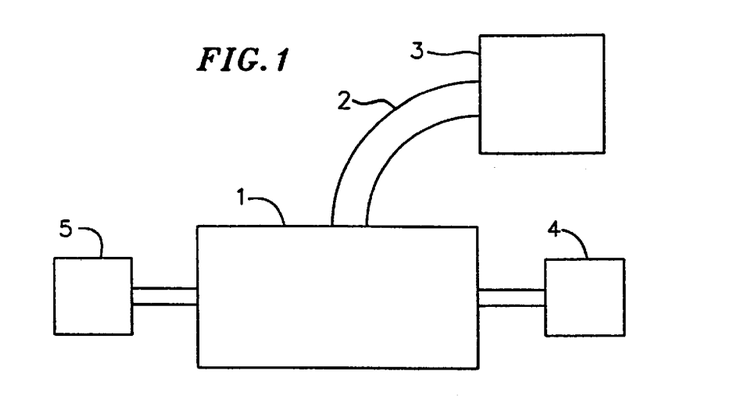
Figure 5:
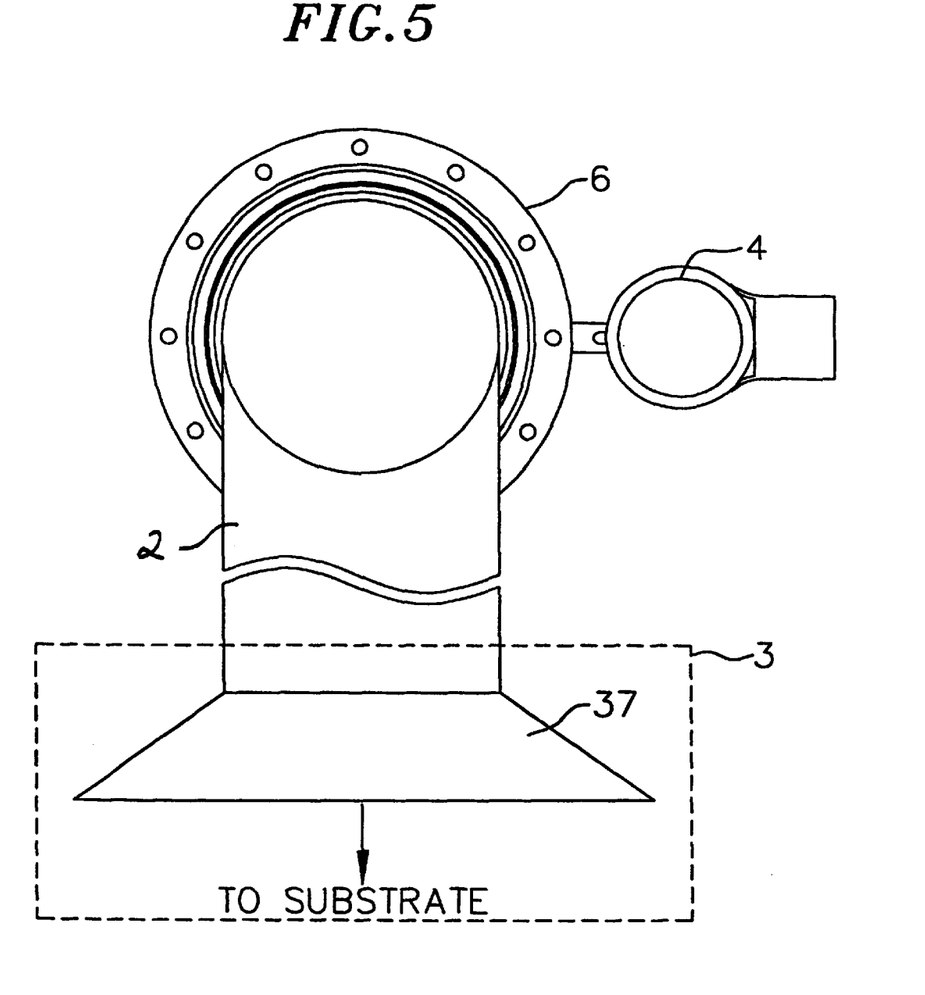

As shown in FIG. 1, and more specifically in FIG. 5, the duct 2 connects the evaporation chamber 1 to the condensation chamber 3 and transports the evaporated material to the condensation chamber 3. Once in the condensation chamber 3, the vapor is passed through one or more nozzles 37 and applied to a substrate. While the present invention may be used to coat an unlimited variety of substrates ranging from compact discs to three meter wide web coaters, the description provided herein will refer to web coaters for convenience of reference.

Figure 2:
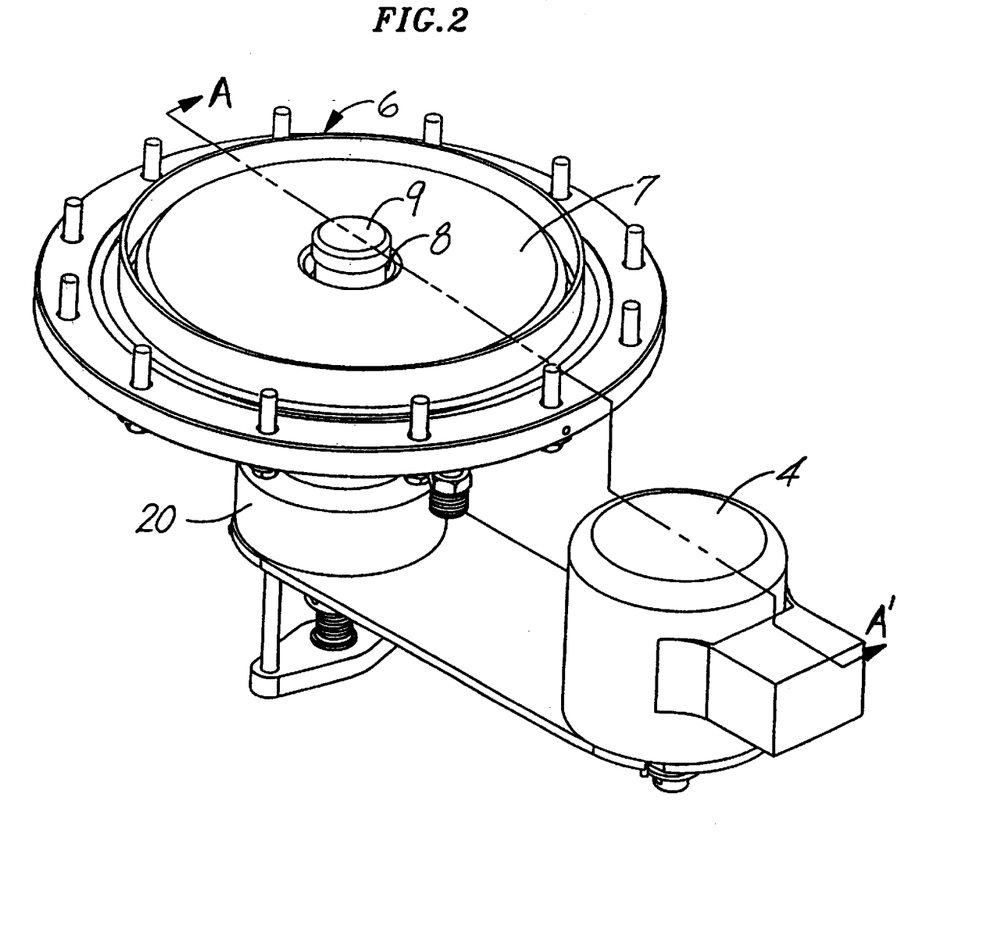

The duct temperature and pressure must be regulated to insure vapor generated from the evaporation chamber does not condense or polymerize in the duct 2. The temperature and pressure of the duct is dependent upon the specific characteristics of the organic liquid being evaporated and condensed. Determining the appropriate duct temperature and pressure by analyzing material characteristics such as the vapor-temperature curve and sensitivity to heat cure is within the skill of one skilled in the relevant art. Duct temperature may be regulated by resistive heating or by placing the duct in thermal contact with a liquid of the required temperature. Ideally, the duct 2 would be of insignificant length, thereby resulting in no pressure drop and requiring no temperature regulation. As a practical matter, the length of the duct should be minimized. For ducts used to transport vapor to a nozzle, typical conditions are 1) a 5% variation of pressure due to friction in the duct along the nozzle length, 2) a vapor temperature of 450 K, and 3) a molecular weight of 600.

To effectively attain uniform thickness of the condensate on the final product, the flow of vapor out of the nozzle must be choked or, in other words, must be at sonic velocity at the nozzle throat. Sonic velocity is attained at the throat of a nozzle when the pressure at the throat is low enough that the ratio of discharge pressure ($P_2$) to entering pressure ($P_1$) is equal to or less than a critical value ($P_2/P_1 \leq CV$). For large molecules, choked flow occurs when the pressure drop is less than 0.6 (downstream pressure<60% of pressure into the nozzle).

Given sonic velocity is attained, the only source of web thickness variation becomes the viscous friction loss along the length of the duct. Because vapor velocity is fixed at sonic velocity at the throat of the nozzle, the only variation in mass flow rate, and thereby the only variation in condensed film thickness, is due to variations in vapor density. Variations in vapor density, in turn, are proportional to pressure variations. The only source of pressure variation, assuming a constant evaporation rate, is viscous friction loss along the length of the duct.

It is important to design the nozzle width and duct diameter in a manner which would provide the requisite pressure drop because a sufficient pressure drop must be available at the nozzle throat to meet the required $P_2/P_1$ ratio. While narrow ducts are employed in the prior art to transport vapor, large ducts have distinct advantages over the narrow ducts currently being used. Specifically, the size of the duct 2 must be large enough so that the frictional pressure drop along the duct length is less than an allowable variation limit. If the pressure drop along the duct is too great, the critical value will be exceeded and the maximum film thickness variation limit will be violated. Large ducts permit the operational evaporation pressure to be reduced. A reduction in operational evaporation pressure reduces the required operational evaporation temperature, thereby minimizing polymerization and cracking and allowing for the vaporization of larger molecules while imparting less energy to the vapor which, consequently, facilitates the condensation of the vapor. Because of an increased ease in condensation, an increased range in low molecular weight liquids may be employed in the present invention.

Uniformity across the web is obtained with choked flow through a nozzle of constant height, a width equal to that of the web and a uniform pressure on the upstream side. The difficulty, however, is maintaining a constant pressure immediately upstream of the nozzle, especially if the evaporator pressure is to be kept low, since the volumetric flow rates are very large.

To determine what duct diameter and nozzle width should be employed to achieve uniform condensation on the substrate, the following equations may be employed:

$$\text{Duct Diameter } (D) = 3.5 \, [(dm/dt) \ast L/(P_{mean})^2]^{1/4}$$

where

D=duct diameter (meters)

dm/dt=mass flow rate (kg/sec)

L=duct length (meters)

$P_{mean}$=mean pressure (pascal)

$$\text{Nozzle opening width } (h) = [dm/dt/(P_{mean}L)][(RT)/(\eta\Gamma)]^{1/2}$$

where dm/dt=mass flow rate $P_{mean}$=mean pressure

L=nozzle length

R=gas constant=8315 J/mole-K

T=temperature in Kelvins

η=molecular weight

Γ=adiabatic exponent of vapor (about 1.15 for large molecules)

The duct diameter equation is a simplification of the full differential equation provided herein. In practice, the aforementioned typical duct conditions for vapor temperature (450 K) and molecular weight (600), vary from about 420 K to about 560 K for vapor temperature and from about 200 to about 1000 for molecular weight. Because the optimal duct diameter is in part defined by the actual vapor temperature of the system and molecular weight of the material, the variation in vapor temperature and molecular weight can be used to define a range for the optimal duct diameter. The approximate minimum of the range can be calculated as a percentage of the central value, provided by the aforementioned equation, by the following formula:

$$PCV_{min} = [(VT_{min})/(VT_{central})]^{1/4} \ast [(MW_{min})/(MW_{central})]^{5/24}$$

where $PCV_{min}$=Percentage of Central Value (Min.)

$VT_{min}$=Vapor Temperature (Min.)=420 K $VT_{central}$=Vapor Temperature (Central)=450 K $MW_{min}$=Molecular Weight (Min.)=200 K $MW_{central}$=Molecular Weight (Central)=600 K Similarly, the approximate maximum of the range can be calculated by the following formula:

$$PCV_{max} = [(VT_{max})/(VT_{central})]^{1/4} \ast [(MW_{max})/(MW_{central})]^{5/24}$$

where $PCV_{max}$=Percentage of Central Value (Max.)

$VT_{max}$=Vapor Temperature (Max)=560 K $VT_{central}$=Vapor Temperature (Central)=450 K $MW_{max}$=Molecular Weight (Max)=1000 K $MW_{central}$=Molecular Weight (Central)=600 K When calculated, the minimum and maximum ranges for vapor temperature and molecular weight define the optimal duct diameter to be within 25% of the nominal value, as provided by the aforementioned equation. In practice, the duct diameter should be, at minimum, larger than 75% of the nominal (theoretical) value.

It would further be possible to compensate for the 5% variation in mass flow rate existing within the duct/nozzle system by using a nozzle having a width that varies along its length. Because mass flow rate through a nozzle is proportional to its area, properly designed width variation, thereby causing a variation in area, could effectively compensate for the 5% mass flow variation. For example, a nozzle that tapers out from a width of 10 mm to 10.5 mm could be employed.

To optimally operate the liquid delivery system and evaporator apparatus of the present invention, several operational goals should be adhered to. The evaporator should be operated at low pressure because low pressure inhibits polymerization of the organic material being vaporized and permits the generation of cooler vapor, thereby easing condensation. Unlike existing evaporator devices, the present invention is capable of operating at low pressures without prematurely generating vapor and, consequently, highly variable mass flow rates.

Additionally, there must be sufficient surface area of the heated liquid in contact with the vapor in the liquid feed system to enable the use of a large range of mass flow rates. Unlike conventional spinning disk/heated wall evaporators, the present invention provides a large surface area upon which liquid can be radially directed and evaporated, thereby drastically increasing the range of mass flow rates achievable.

To avoid non-uniform evaporation of the liquid once on the evaporation surface, the liquid layer on the rotating surface must be thin enough to avoid the creation of a temperature gradient which would result in incomplete vaporization of the liquid or polymerization of liquid. The uniformity of temperature inside a body is measured by the Biot number which is equal to the ratio of the body's internal resistance to the flow of heat to the body's resistance to heat entering the body.

$$\text{Biot Number } (Bi) = ht/k$$

where h=the film coefficient t=the film thickness k=conductivity

Where Bi<<1 the temperature through the body can be considered uniform. As an example, the thermal conductivity for all acrylates is around 0.2 to 0.3 W/M-K at 100 degrees Celsius and film coefficients for a liquid-solid interface are approximately 100 $W/M^2$-K. In order to get the desired temperature uniformity, the Biot number must be sufficiently less than 1. In this case, a film thickness of 0.1 mm (0.004 inches) would generate a Biot number of 0.04, indicating that the film would be sufficiently uniform in temperature.

Provided the aforementioned operational parameters are generally adhered to, the present invention can be used to evaporate a wide variety of organic liquids while still maintaining a relatively constant mass flow rate and achieving increased operation time over existing evaporators.

While the invention has been described in connection with preferred embodiments, the present invention is not limited to those embodiments and should be considered to include all alternatives, modifications, and equivalents that may be included within the scope of the invention as defined by the claims.

What is claimed is:

1. A method for evaporating an organic liquid and vapor depositing the organic liquid onto a substrate comprising:

heating an evaporator surface to a temperature above an evaporation temperature of the organic liquid when in contact with the evaporator surface and below a temperature which would cause the polymerization or degradation of the liquid when the liquid is in contact with the evaporator surface, rotating the evaporator surface at a speed that generates a centrifugal force on the liquid that spreads the liquid outwardly across the evaporator surface in a layered form that minimizes the existence of a temperature gradient within the liquid layer, delivering liquid to be evaporated to the center of the top face of the evaporator surface such that a constant vapor flow from the evaporator surface is generated, evaporating the delivered liquid, and vapor depositing the evaporated liquid onto the substrate.

2. The method of claim 1 wherein the evaporator surface is a circular disk having a depression.

3. The method of claim 2 wherein the liquid delivery step is performed by controllably supplying liquid to a time varying orifice.

4. The method of claim 3 wherein the heating step is performed by supplying a heated fluid to an enclosure located proximate to the evaporator surface.

5. A method for evaporating and vapor depositing organic material onto a substrate comprising:

heating an evaporator surface to a temperature within a range that is bounded by an evaporation temperature of an organic liquid when in contact with the surface and by a temperature which causes the polymerization or degradation of the liquid when the liquid is in contact with the evaporator surface, rotating the evaporator surface at a speed that generates a centrifugal force on the liquid that thinly spreads the liquid outwardly across the evaporator surface in a layered form that minimizes the existence of a temperature gradient within the liquid layer, delivering liquid to be evaporated to the center of the top face of the evaporator surface such that a constant vapor flow from the evaporator surface is generated, directing vapor formed off the evaporator surface to a plurality of nozzles, and applying the vapor being discharged from said plurality of nozzles to a substrate.

6. The method of claim 5 wherein the evaporator surface is a circular disk having a depression.

7. The method of claim 6 wherein the liquid delivery step is performed by controllably supplying liquid to a time varying orifice, said orifice being capable of controlling the rate of liquid flow.

8. The method of claim 7 wherein the heating step is performed by supplying a heated fluid to an enclosure located proximate to the evaporator surface.

9. A method for evaporating and vapor depositing material onto a substrate comprising the steps of:

evaporating material in a controlled environment;

transporting said evaporated material through a duct having a diameter greater than or equal to 75% of the value prescribed by the equation:

$$3.5\{(dm/dt)*L/(P_{mean})^2\}^{1/4}$$

where dm/dt=mass flow rate in kg/sec

L=duct length in meters $P_{mean}$=mean pressure in pascal; and vapor depositing said evaporated material onto the substrate.

10. The method of claim 9 wherein vapor depositing includes passing said evaporated material through a nozzle having a width that is not constant along the length of the nozzle; and condensing the evaporated material onto a substrate.

* * * * *